US007034735B1

(12) United States Patent
Copley (10) Patent No.: US 7,034,735 B1
(45) Date of Patent: Apr. 25, 2006

(54) TRIM CIRCUITS AND METHODOLOGIES FOR DATA CONVERTERS

(75) Inventor: Patrick Philip Copley, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 11/108,895

(22) Filed: Apr. 19, 2005

(51) Int. Cl.
*H03M 1/78* (2006.01)

(52) U.S. Cl. ........................................ 341/154; 341/155
(58) Field of Classification Search ................. 341/154
See application file for complete search history.

(56) References Cited

U.S. PATENT DOCUMENTS

| 4,686,511 A * | 8/1987 | Koen ........................... 341/118 |
| 4,891,645 A | 1/1990 | Lewis et al. |
| 5,010,337 A | 4/1991 | Hisano et al. |
| 5,302,951 A | 4/1994 | Yamashita |
| 6,061,289 A | 5/2000 | Itoh et al. |
| 6,310,567 B1 | 10/2001 | Copley et al. |
| 6,486,818 B1 * | 11/2002 | Nicholson et al. ........... 341/154 |
| 6,642,867 B1 * | 11/2003 | Chowdhury et al. ......... 341/118 |

OTHER PUBLICATIONS

LTC1599; LT/TP 1199 4K; "16-Bit Byte Wide, Low Glitch Multiplying DAC with 4-Quandrant Resistors"; Linear Techhnology Corporation; c. 1999; pp. 1-20; USA, no month.

* cited by examiner

*Primary Examiner*—Peguy JeanPierre
*Assistant Examiner*—Joseph Lauture
(74) *Attorney, Agent, or Firm*—McDermott Will & Emery LLP (57) ABSTRACT

An improved digital-to-analog converter comprises a reference node, switches providing an input digital signal, and an output stage including at least one resistive element. A resistance ladder, coupled to the switches, includes branches corresponding respectively to bit positions, in which selective operation of the switches in response to the input digital signal produces a corresponding analog output signal from the output stage. The ladder includes a first trim structure coupled to the most significant bit position (MSB) and a second trim structure in the output stage resistive element or elements. The first trim structure is configured to adjust the gain of the converter without affecting the relative bit weights of the bit positions, and wherein the resistances of the first and second trim structures are substantially of a prescribed ratio prior to any trimming.

15 Claims, 5 Drawing Sheets

TRIM CIRCUITS AND METHODOLOGIES FOR DATA CONVERTERS

TECHNICAL FIELD

This disclosure relates generally to digital-to-analog converters, and more particularly to improvements in trimming circuitry and methodology that may be implemented therein

BACKGROUND

A digital-to-analog converter (DAC) converts a digital input word to an analog output signal. DACs typically operate in either a unipolar or bipolar mode. The generic equation for determining the output $V_{OUT}$ in unipolar and bipolar DACs is shown in Equation 1:

$$V_{OUT} = G * V_{REF} * \left( K1 * \frac{\text{INPUT CODE}}{2^n} - K2 \right) \quad (1)$$

where INPUT CODE is an n-bit digital word, G is the gain of the DAC and K1 and K2 are constants that determine the configuration mode. In unipolar mode configuration (e.g., when the output varies from 0 volts to $V_{REF}$), K1=1 and K2=0 so that $V_{OUT}$ varies between 0 and $G*V_{REF}$. In bipolar mode configuration (e.g., output varies from $-V_{REF}$ to $V_{REF}$), K1=2 and K2=1 so that $V_{OUT}$ varies between $-G*V_{REF}$ and $G*V_{REF}$. For the inverting unipolar configuration K1=-1 and K2=0 so that $V_{OUT}$ varies between 0 and $-G*V_{REF}$.

Figure 1:
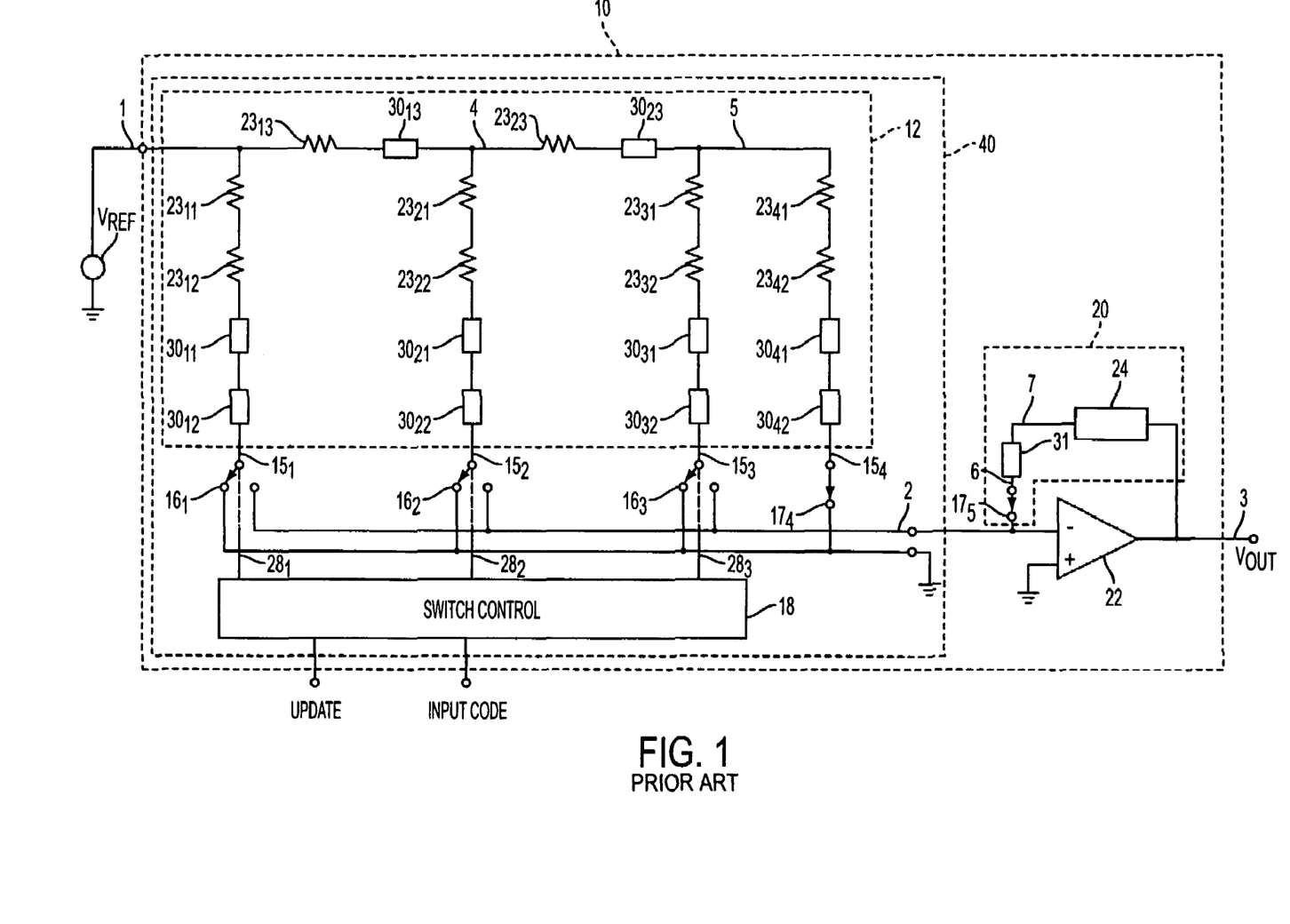
FIG. 1 is a circuit diagram showing a conventional unipolar DAC having trim structures.

FIG. 1 shows the example of a well known architecture of an inverting unipolar 3-bit DAC 10, which receives input $V_{REF}$, control signal UPDATE and digital input INPUT CODE, and generates analog output $V_{OUT}$. The DAC of FIG. 1 has 3-bit resolution (i.e. n=3) for illustration only and can easily be modified to any practical resolution desired. The digital input INPUT CODE is a 3-bit digital word used by DAC 10 to convert input $V_{REF}$ into analog output $V_{OUT}$. UPDATE is a binary control signal which determines when the digital word INPUT CODE can be used to convert $V_{REF}$ to produce a new $V_{OUT}$. When UPDATE is LOW, $V_{OUT}$ remains substantially constant. When UPDATE changes from LOW to HIGH, DAC 10 converts $V_{REF}$ to analog output $V_{OUT}$ based on the digital input INPUT CODE.

DAC 10 comprises resistor ladder 12, switches $16_1$, $16_2$ and $16_3$, switch compensation element $17_4$, switch control block 18, op-amp 22 and feedback element 20. Resistor ladder 12 is of a type commonly called an R-2R ladder, and includes substantially identical fixed resistors $23_{11}$ to $23_{42}$ and substantially identical trim structures $30_{11}$ to $30_{42}$. The input $V_{REF}$ is applied to input node 1 of DAC 10 while the output $V_{OUT}$ is produced at output node 3. An additional DAC node referred henceforth as GROUND is used as reference potential for both input $V_{REF}$ and output $V_{OUT}$.

Resistor ladder 12 receives the input $V_{REF}$ on node 1, is connected to switches $16_1$, $16_2$ and $16_3$ through nodes $15_1$, $15_2$ and $15_3$, respectively, and to switch compensation element $17_4$ through node $15_4$. It comprises a number of switched and series branches. The first switched connected in series, and is coupled between input node 1 and node $15_1$. It functions as the most significant bit (MSB) of the ladder. The first series branch comprises fixed resistor $23_{13}$ and trim structure $30_{13}$, connected in series, and is coupled between input node 1 and network and two trim structures $30_{21}$ and $30_{22}$, all connected in series, and is coupled between internal node 4 and node $15_2$. It functions as the second bit of the ladder. The second series branch comprises fixed resistor $23_{23}$ and trim structure $30_{23}$, connected in series, and is coupled between internal node 4 and internal node 5. The third switched branch comprises two fixed resistors, $23_{31}$, and $23_{32}$, and two trim structures $30_{31}$ and $30_{32}$, all connected in series, and is coupled between internal node 5 and node $15_3$. It functions as the least significant bit (LSB) structures $30_{41}$ and $30_{42}$, all connected in series, and is coupled between internal node 5 and node $15_4$. It functions as the ladder termination and is connected to GROUND through the switch resistance compensation element $17_4$.

In describing an R-2R ladder, the series branches are conventionally called the R-branches, and the switched branches and the termination branch are called the 2R-branches.

Switch control block 18 receives control input UPDATE and digital input INPUT CODE. When UPDATE changes state from LOW to HIGH, switch control block 18 adjusts the states of switch control nodes $28_1$ through $28_3$, according the present value of INPUT CODE. In this example of a 3-bit DAC, INPUT CODE will be a 3-bit binary signal. When the most significant bit (MSB) of INPUT CODE is HIGH, the switch control 18 will set node $28_1$ directing switch $16_1$ to couple node $15_1$ to node 2. When the most significant bit (MSB) of INPUT CODE is LOW, switch control 18 will set node $28_1$ directing switch $16_1$ to couple node $15_1$ to GROUND. Similarly, a HIGH or LOW state in the second bit of INPUT CODE will result in switch control 18 setting node $28_2$ directing switch $16_2$ to couple node $15_2$ to node 2 or GROUND respectively. A HIGH or LOW state in the third, least significant bit (LSB), of INPUT CODE will result in switch control 18 setting node $28_3$ directing switch $16_3$ to couple node $15_3$ to node 2 or GROUND respectively. In the manner described, the digital input INPUT CODE in combination with input $V_{REF}$ causes an intermediate current, $I_{DAC}$ to flow into node 2 from the switch elements $16_1$ to $16_3$ according to Equation 2, where $R_{DAC}$ is the input impedance of the R-2R ladder:

$$I_{DAC} = \left(\frac{V_{REF}}{R_{DAC}}\right) * \left(\frac{\text{INPUT CODE}}{2^n}\right) \quad (2)$$
$$= \left(\frac{V_{REF}}{R_{DAC}}\right) * \left(\frac{\text{INPUT CODE}}{8}\right)$$

Feedback element 20 and op-amp 22 form a current-to-voltage converter. The op-amp 22 has an inverting input terminal (−) coupled to node 2, a non-inverting input terminal (+) coupled to GROUND, and an output terminal coupled to node 3. Feedback element 20, coupled between node 2 and node 3, creates a feedback loop around the op-amp 22.

Feedback element 20 comprise fixed resistor 24, trim structure 31, and switch resistance compensation element $17_5$, all connected in series. The total resistance of feedback element 20 is commonly referred to as $R_{FB}$.

The current to voltage converter operates to convert intermediate current $I_{DAC}$ into output voltage $V_{OUT}$. The resulting $V_{OUT}$ is described by Equation 3:

$$V_{OUT} = -I_{DAC} * R_{FB} \quad (3)$$

$$= -V_{REF} * \left(\frac{R_{FB}}{R_{DAC}}\right) * \left(\frac{\text{INPUT CODE}}{2^n}\right)$$

$$= -V_{REF} * \left(\frac{R_{FB}}{R_{DAC}}\right) * \left(\frac{\text{INPUT CODE}}{8}\right)$$

For the 3-bit DAC example, MAX INPUT CODE=$2^3-=7$.

When DIGITAL INPUT=0:

$V_{OUT}$=0V, corresponding to ZERO SCALE and when DIGITAL INPUT=7:

$$V_{OUT} = -V_{REF} * \left(\frac{R_{FB}}{R_{DAC}}\right) * \left(\frac{7}{8}\right),$$

corresponding to FULL SCALE

From equation (3), the value of $V_{OUT}$ is scaled by the ratio $R_{FB}/R_{DAC}$. Comparing equations (3) and (1) it is immediate that $G=(R_{FB}/R_{DAC})$. A common choice for a unipolar DAC is G=1 requiring $R_{FB}=R_{DAC}$. It is highly desirable for ratio G to be accurate, stable with respect to external factors like temperature, time, etc. and have minimal pre-trim errors. Thus it is common practice to maintain, with a high degree of accuracy, the same ratio G between constituent structures of the same type contained in feedback element 20 and ladder 12. Toward this goal corresponding feedback element and ladder components of same type (i.e. fixed resistors, trim structures and switches) are implemented using mutually identical unit components with good matching properties.

Figure 2:
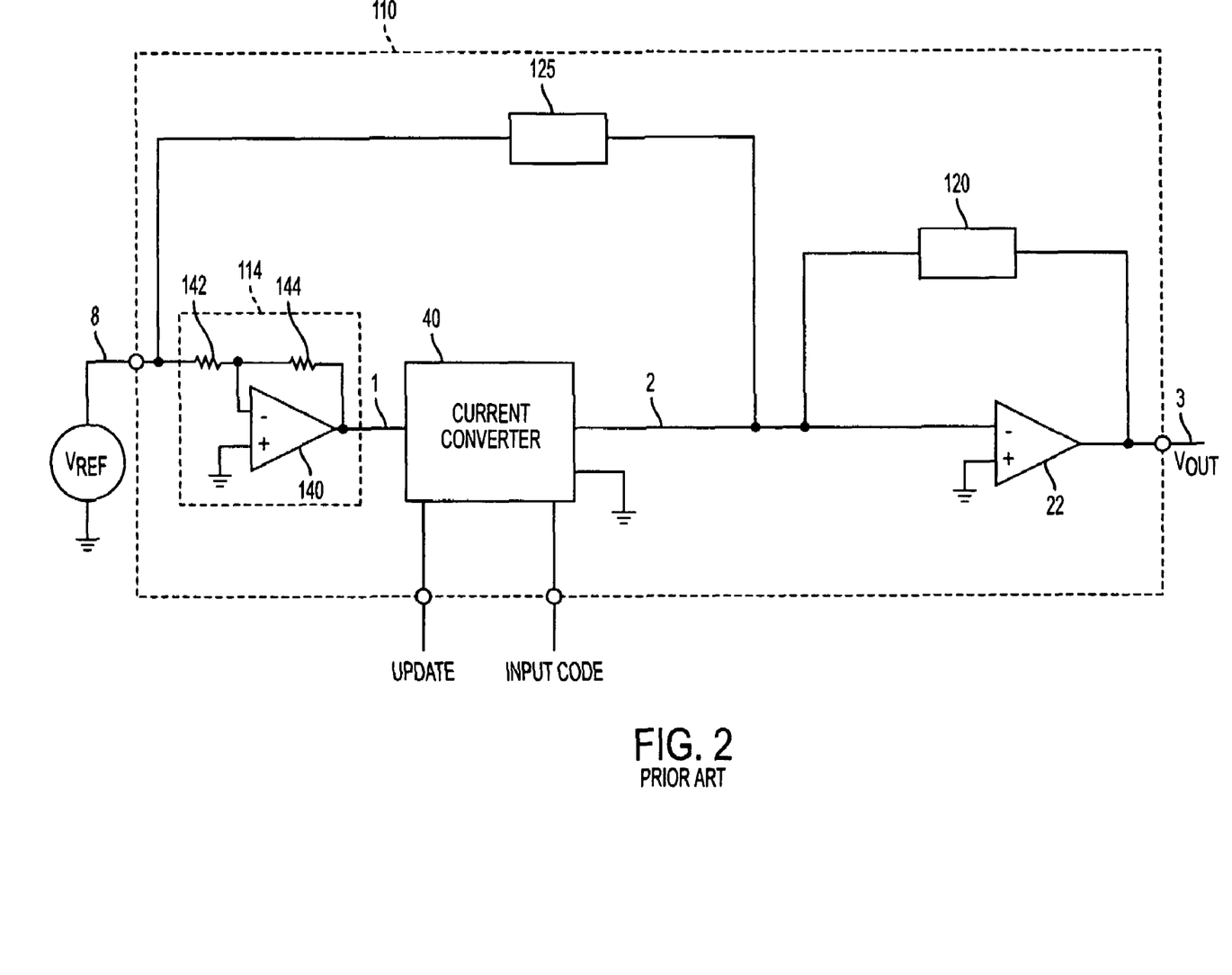
FIG. 2 is a circuit diagram showing a conventional bipolar DAC having trim structures.

FIG. 2 shows a known bipolar DAC 110 comprising current converter 40, reference inverting circuit 114, offset resistive element 125, op-amp 22 and feedback element 120. DAC 110 receives input $V_{REF}$, control signal UPDATE and digital input INPUT CODE and generates analog output $V_{OUT}$. The input $V_{REF}$ is applied to input node 8 of DAC 110 while the output $V_{OUT}$ is produced at output node 3.

The reference inverting circuit 114, comprising op-amp 140 and gain resistors 142 and 144 is configured as a standard inverting buffer amplifier. It has an input terminal coupled to input node 8 and an output terminal connected to internal node 1. Input gain resistor 142 is connected between node 8 and the inverting input of op-amp 140 while feedback gain resistor 144 is connected between output and inverting input of op-amp 140. The non-inverting input of op-amp 140 is connected to GROUND. The output of op-amp 140 is connected to internal node 1. The reference inverting circuit 114 serves to produce an inverted $V_{REF}$ (i.e., $-V_{REF}$) signal at node 1. The Current Converter 40, coupled between internal nodes 1 and 2 is described in detail in FIG. 1.

Alternatively, amplifier 140 and resistors 142 and 144 could be external to signal processor 110 in the signal path.

The offset resistive element 125, coupled between input node 8 and internal node 2, has an internal structure similar to feedback element 20 comprising a fixed resistor structure, a trim structure, and a switch resistance compensation element, all connected in series. The total resistance of offset resistive element 125 is referred to as $R_{OFFSET}$.

Feedback element 120 and op-amp 22 form a current-to-voltage converter. The op-amp 22 has an inverting input terminal (−) coupled to node 2, a non-inverting input terminal (+) coupled to GROUND, and an output terminal coupled to node 3. Feedback element 120, coupled between node 2 and node 3, creates a feedback loop around the op-amp 22. Feedback element 120 has similar internal structure as previously described feedback element 20, and comprises a fixed resistor structure, a trim structure, and a switch resistance compensation element, all connected in series. The total resistance of feedback resistor element 120 is referred to as $R_{FB}$.

In the same manner described above for DAC 10 of FIG. 1, the digital input INPUT CODE in combination with the input signal present at node 1 causes an intermediate current, $I_{DAC}$ to flow into node 2 from the converter 40 according to Equation 4, where $R_{DAC}$ is the input impedance of the R-2R ladder and the signal on node 1 is $-V_{REF}$:

$$I_{DAC}=(-V_{REF}/R_{DAC})\cdot(\text{INPUT CODE}/2^n) \qquad (4)$$

A second signal path from input node 8 through offset resistive element 125 to node 2 causes a second intermediate current, $I_{OFFSET}$ to flow into node 2 according to Equation 5:

$$I_{OFFSET}=(V_{REF}/R_{OFFSET}) \qquad (5)$$

The current to voltage converter operates to convert the sum of the intermediate currents $I_{DAC}$ and $I_{OFFSET}$ to the output $V_{OUT}$. The resulting $V_{OUT}$ is described by Equation 6:

$$V_{OUT}=-(I_{DAC}+I_{OFFSET})\cdot R_{FB}$$

$$=V_{REF}[(R_{FB}/R_{DAC})*(\text{INPUT CODE}/2^n)-(R_{FB}/R_{OFFSET})] \qquad (6)$$

For a 3-bit DAC example, $2^n=8$ and MAX INPUT CODE=$2^3-1=7$.

Thus for DIGITAL INPUT=0:

$$V_{OUT}=-V_{REF}(R_{FB}/R_{OFFSET})$$

And for DIGITAL INPUT=7:

$$V_{OUT}=V_{REF}*[(R_{FB}/R_{DAC})*(7/8)-(R_{FB}/R_{OFFSET})]$$

From equation (6), the value of $V_{OUT}$ is scaled by the ratio $R_{FB}/R_{DAC}$ and is offset by the ratio $R_{FB}/R_{DAC}$. By comparison to equation (1), as K2=1 for a bipolar DAC, it results:

$$(R_{FB}/R_{OFFSET})=1$$

Therefore $$R_{FB}=R_{OFFSET}$$

By further comparison to equation (1) it results:

$$G=(R_{FB}/R_{DAC})/K1$$

A common choice for a bipolar DAC is G=1, resulting in $$R_{FB}=2*R_{DAC}$$

To maintain an accurate transfer function for DAC 110 as given by equation 6, it is therefore highly desirable for ratios $R_{FB}/R_{DAC}$, and $R_{FB}/R_{OFFSET}$ to be accurate, stable with respect to external factors like temperature, time, etc. and have minimal pre-trim errors. Thus it is common practice to maintain, with a high degree of accuracy, the same ratio between constituent structures of the same type contained in feedback element 120 and current converter 40. Toward this goal, corresponding feedback element and current converter components of same type (i.e. fixed resistors, trim structures and switches) are implemented using mutually identical unit components with good matching properties. Furthermore it is common practice to maintain, with a high degree of accuracy, the same ratio between constituent structures of the same type contained in feedback element 120 and offset resistive element 125. Toward this goal, corresponding feedback element and offset resistive element components of same type (i.e. fixed resistors, trim structures and switch resistance compensation structures) are implemented using mutually identical unit components with good matching properties.

DAC 110 shows one technique for applying opposite polarity to the current converter and to the level shift structure, a condition which is required for this type of bipolar DAC. However, other suitable techniques for establishing this condition are well-known in the art.

The prior art includes various configurations of DAC 10 and DAC 110 in monolithic or discrete form. The configurations are typically chosen to be unipolar, bipolar or a combination thereof, such as a software programmable signal processor of a type described in U.S. Pat. No. 6,310,567, incorporated herein by reference.

A person skilled in the art will be familiar with resistor ladder 12 and other versions of R-2R ladder networks, and will be aware that R-2R ladders are classic and widely employed examples of networks whose transfer functions depend primarily on the ratio matching of identical unit elements of the constituent structures.

Errors in resistor ladder 12, current converter 40, feedback elements 20 and 120 and offset resistive element 125 are caused by the resistances and switches in each of the branches not matching or ratioing exactly. It is common practice to use mutually identical unit resistors like fixed resistors $23_{11}$ through $23_{42}$ of resistor ladder 12 when implementing such networks in order to minimize matching errors. Nevertheless, matching errors between identical fixed elements are inherent in any practical implementation and result in transfer function linearity errors. The problem is usually alleviated by connecting adjustable structures like trim structures $30_{11}$ through $30_{42}$ in series with fixed resistors. Such trim structures can be adjusted in calibration processes such as to correct residual mismatch of the fixed elements. In order to further reduce mismatch errors it is common practice to use trim structures which are mutually identical prior to any trimming and to associate a trim structure to every fixed element in the network. In this manner every constituent structure of the network has the same ratio between the value and number of fixed elements to trim structures Mismatch between different branches of resistor ladder 12 produce Linearity Errors in the DAC transfer function and are adjusted using the built-in trim structures $30_{11}$ through $30_{42}$. Errors in $R_{FB}/R_{DAC}$ ratio introduce a gain error in transfer functions of both unipolar DAC 10 and bipolar DAC 110 commonly called Gain Error. Errors in $R_{FB}/R_{OFFSET}$ ratio introduce an undesired offset in transfer function of bipolar DAC 110 commonly called Bipolar Offset Error. Gain Errors and Bipolar Offset Errors must be corrected in a calibration process in the same manner as Linearity Errors.

For unipolar DAC 10 the Gain Error is commonly adjusted using the trim structure contained by feedback element 20. For bipolar DAC 110 the Gain Error is commonly adjusted using the trim structure contained by feedback element 120. Similarly the Bipolar Offset Error of DAC 110 is adjusted using the trim structure contained by the offset resistive element 125.

When trim structures are adjusted by laser trimming of fuse links or other common techniques their value typically can only be increased. Thus, when Linearity Errors are reduced using the trim structures $30_{11}$ through $30_{42}$, the ladder equivalent impedance $R_{DAC}$ is increased thus changing the ratio $R_{FB}/R_{DAC}$ and producing a Gain Error. Due to this undesired interaction the Gain Error adjustment must be performed after the Linearity Error adjustment.

For the bipolar DAC 110, a change in value of $R_{FB}$ during Gain Error adjustment modifies the ratio $R_{FB}/R_{OFFSET}$ and thus produces a Bipolar Offset Error. Therefore for a bipolar DAC a Linearity Error adjustment must be followed by a Gain Error adjustment and subsequently by a Bipolar Offset Error adjustment.

A problem will occur in implementing this adjustment sequence if, following a Linearity Error correction, the ratio $R_{FB}/R_{DAC}$ is higher than desired. Because the value $R_{FB}$ can only be increased through the adjustment process it is not possible to directly lower the ratio $R_{FB}/R_{DAC}$. This suggests the option of increasing the value of $R_{DAC}$. However, with resistor networks commonly used in implementing DACs, a change in $R_{DAC}$ will directly result in Linearity Errors. In addition many practical adjustment means, including laser trim, can be used one time only on any given trim structure. Therefore, once linearity trimming is completed it is generally not possible to make any further adjustments to the trim structures $30_{11}$ through $30_{42}$. Thus the Gain Error adjustment is, for all practical purposes, a "unidirectional trim" able to correct only a negative Gain Error and must be performed after Linearity Error adjustments.

A common solution for this problem is to introduce a systematic negative pre-trim Gain Error so large that it will remain negative following the worst case Linearity Error adjustment. This strategy has significant undesirable consequences. It requires a substantial increase in the trim range resulting in substantially larger trim structures. Due to the "worst case" design target most DACs will need to by adjusted by large amounts resulting in excessively long trim time and increased likelihood of post-trim drift.

Another common solution is to add a "look-ahead" calculation and additional skew trim within the linearity trim procedure such as to insure that the Gain Error will remain slightly negative following Linearity Error adjustment. According to this strategy attempts are made to predict the resulting Gain Error at intermediary steps in the Linearity Error adjustment and corrective skew trims are applied. While preferable to the previous solution, this approach has its own undesirable consequences. The prediction process requires complex measurements and calculations which together with the additional skew trim operations substantially increase the overall adjustment time. Moreover additional trim range is still necessary forcing an increase in size for certain trim structures. An increase in size for some trim structures results in a size increase for all trim structures because, in order to reduce pre-trim matching errors, the use of mutually identical structures is highly desirable. Furthermore the prediction algorithm is complex and imperfect thus not always effective.

SUMMARY

Accordingly, one aspect of this disclosure is in providing methods and apparatus for making bi-directional trim adjustments to certain parameters, including Gain Error and Bipolar Offset Error, to digital-to-analog converters (DACs) without disturbing the DAC linearity, without introducing significant additional pre-trim systematic or random errors, and without requiring 'look ahead', or pre-compensation in the linearity trim procedure.

In accord with one implementation of the disclosure, a digital-to-analog converter comprises a reference node, switches providing an input digital signal and an output stage including at least one resistive element. A resistance ladder coupled to the switches includes branches corresponding respectively to bit positions, in which selective operation of the switches in response to the input digital signal produces a corresponding analog output signal from the output stage. A first trim structure is coupled to the most significant bit position (MSB) of the resistance ladder, and a second trim structure is provided in the at least one output stage resistive element. The first trim structure is configured to adjust the gain of the digital-to-analog converter without affecting the relative bit weights of the bit positions. The resistances of the first and second trim structures, respectively, are substantially of a prescribed ratio.

Additional advantages of the teachings herein will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawing and in which like reference numerals refer to similar elements and in which.

DETAILED DESCRIPTION

Figure 3:
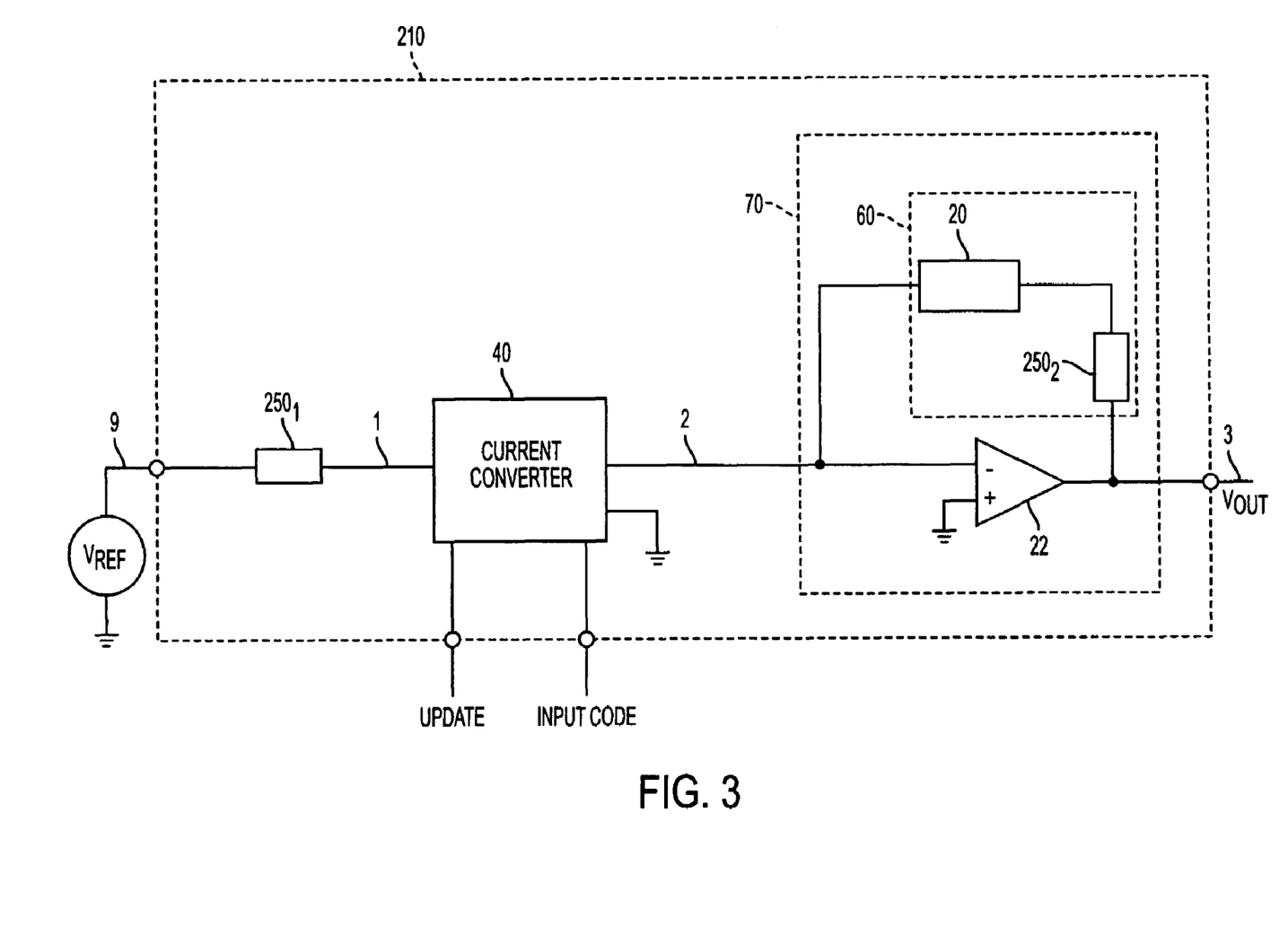
FIG. 3 is a circuit diagram showing a unipolar DAC having trim structures similar to that in FIG. 1, improved in accord with the principles taught herein.

FIG. 3 shows a unipolar DAC 210 similar to DAC 10 improved according to the principles taught by the present invention. DAC 210 comprises current converter 40, output stage 70 and first trim structure $250_1$. The input $V_{REF}$ is applied to input node 9 while the output $V_{OUT}$ is produced at output node 3. An additional DAC node referred henceforth as GROUND is used as a reference potential for both input $V_{REF}$ and output $V_{OUT}$.

Current converter 40, described in FIG. 1 receives control input UPDATE and digital input INPUT CODE and is coupled between nodes 1, 2 and GROUND of DAC 210. The output node 2 of current converter 40 is connected to input terminal of output stage 70. The output terminal of output stage 70 is connected to output node 3 of DAC 210. The output stage 70 comprises op-amp 22 and resistive element 60. Resistive element 60, comprising series combination of feedback element 20 and second trim structure $250_2$, is coupled between nodes 2 and 3 implementing a feedback path around op-amp 22. The pre-trim resistance of second trim structure $250_2$ is referred to as $RT_2$. DAC 210 further comprises first trim structure $250_1$ coupled between input node 9 and current converter 40 input node 1. Thus first trim structure $250_1$ is coupled to the most significant bit (MSB) position of the resistance ladder 12 comprised within current converter 40. The pre-trim resistance of first trim structure $250_1$ is referred to as $RT_1$. For illustrative purposes, second trim structure $250_2$ is shown in FIG. 3 coupled between feedback element 20 and output node 3. However, it will be obvious to those skilled in the art that the relative positions of the trim structure $250_2$ and the series connected components of feedback element 20 (i.e. fixed resistor 24, trim structure 31, and switch resistance compensation element 175) can be changed if desired without affecting circuit behavior.

DAC 210 ladder pre-trim equivalent input resistance $RT_{DAC}$ is the series combination of current converter 40 equivalent input resistor $R_{DAC}$ and first trim structure $250_1$ pre-trim resistance $RT_1$ thus:

$$RT_{DAC}=R_{DAC}+RT_1.$$

The resistive element 60 pre-trim equivalent resistance $RT_{FB}$ is the series combination of feedback element 20 equivalent resistance $R_{FB}$ and second trim structure $250_2$ pre-trim resistance $RT_2$ thus:

$$RT_{FB}=R_{FB}+RT_2.$$

It is apparent to persons skilled in the art that DAC 210 transfer function is described by the same equation (3) as previously derived DAC 10 transfer function in which $R_{DAC}$ is replaced by $RT_{DAC}$ and $R_{FB}$ is replaced by $RT_{FB}$. Consequently the gain G of the unipolar DAC 210 is:

$$G=RT_{FB}/RT_{DAC}=(R_{FB}+RT_2)/(R_{DAC}+RT_1)$$

As aforesaid it is highly desirable for ratio G to be accurate, stable with respect to external factors like temperature, time, etc. and suffer minimal pre-trim errors. Toward this goal, first trim structure $250_1$ and second trim structure $250_2$ are preferably constructed of mutually identical unit components configured to make pre-trim ratio $RT_2/RT_1$ equal $R_{FB}/R_{DAC}$ ratio. Thus the nominal gain ratio G of DAC 210 is substantially identical with gain ratio G of DAC 10.

$$RT_{FB}/RT_{DAC}=(R_{FB}+RT_2)/(R_{DAC}+RT_1)=R_{FB}/R_{DAC}$$

It should be noted that no restrictions have been introduced with respect to ratios of any one value $RT_1$, $RT_2$ and any one value $R_{DAC}$, $R_{FB}$. Therefore mutually identical unit components used to construct first trim structure $250_1$ and second trim structure $250_2$ may differ from mutually identical unit components used to construct feedback element 20 and resistor ladder 12. Trim structures $250_1$ and $250_2$ may be purposefully sized for trim range and resolution as required by Gain Error adjustment without compromising optimal sizing of feedback element 20 and resistor ladder 12 constituent trim structures.

Persons skilled in the art will recognized from gain ratio G expression derived above that properly sized trim structures $250_1$ and $250_2$ enable Gain Error adjustment for any practical ratio $R_{FB}/R_{DAC}$ that may exist following Linearity Error adjustment.

In a preferred method, Gain Error adjustment is performed in two steps, following Linearity Error adjustment. Current converter 40 equivalent input resistor changes from pre-trim nominal value $R_{DAC}$ to post-trim value $RPT_{DAC}$ following Linearity Error adjustment. In first step of Gain Error adjustment trim structures $250_1$ and $250_2$ are adjusted from nominal pre-trim values $RT_1$ and $RT_2$ to equal or greater post-trim values $RTPT_1$ and $RTPT_2$ respectively. In second step of Gain Error adjustment the equivalent value of feedback element 20 is adjusted from pre-trim nominal value $R_{FB}$ to an equal or greater post-trim value $RPT_{FB}$.

The gain ratio G following Linearity Error adjustment $$G=(R_{FB}+RT_2)/(RPT_{DAC}+RT_1)$$

may be less or greater than a final target value. The first step of Gain Error adjustment shall insure that ratio G is less than the target value and close enough to said target value for the residual gain error to fall within the trim range of feedback element 20. Thus, if ratio G is greater than target value, trim structure 250$_1$ should be adjusted increasing $RT_1$ accordingly. If ratio G is less than target value, trim structure 250$_2$ should be adjusted increasing $RT_2$ accordingly. It is commonly known that under certain conditions multiple sequential iterative adjustments of both trim structures 250$_1$ and 250$_2$ may be desirable in order to reduce trim resolution requirement. Trim structures 250$_1$ and 250$_2$ should be sized recognizing that the trim range available must be large enough to account for worst case changes in $R_{DAC}$ following Linearity Error adjustment and for worst case pre-trim errors in $R_{FB}$ value. The trim resolution built in at least one of trim structures 250$_1$ and 250$_2$ must be fine enough to lower the residual gain error of ratio G with respect to target within the trim range available in feedback element 20.

Gain ratio G, following first step of Gain Error adjustment is:

$$G=(R_{FB}+RTPT_2)/(RPT_{DAC}+RTPT_1)$$

The second step of Gain Error adjustment should make ratio G substantially equal to target value using the trim element contained within feedback element 20.

An additional benefit of the present invention and preferred method is reduced trim resolution for trim structures 250$_1$ and 250$_2$. As aforementioned, in the desire to reduce pre-trim matching errors, mutually identical unit components are commonly used in implementing constituent trim elements for feedback element 20 and resistor ladder 12. Thus the trim resolution available within feedback element 20 is very fine as it must match the trim resolution required by Linearity Error adjustment. Using this inherent fine resolution in second step of Gain Error adjustment substantially reduces the trim resolution required from trim structures 250$_1$ and 250$_2$.

Figure 4:
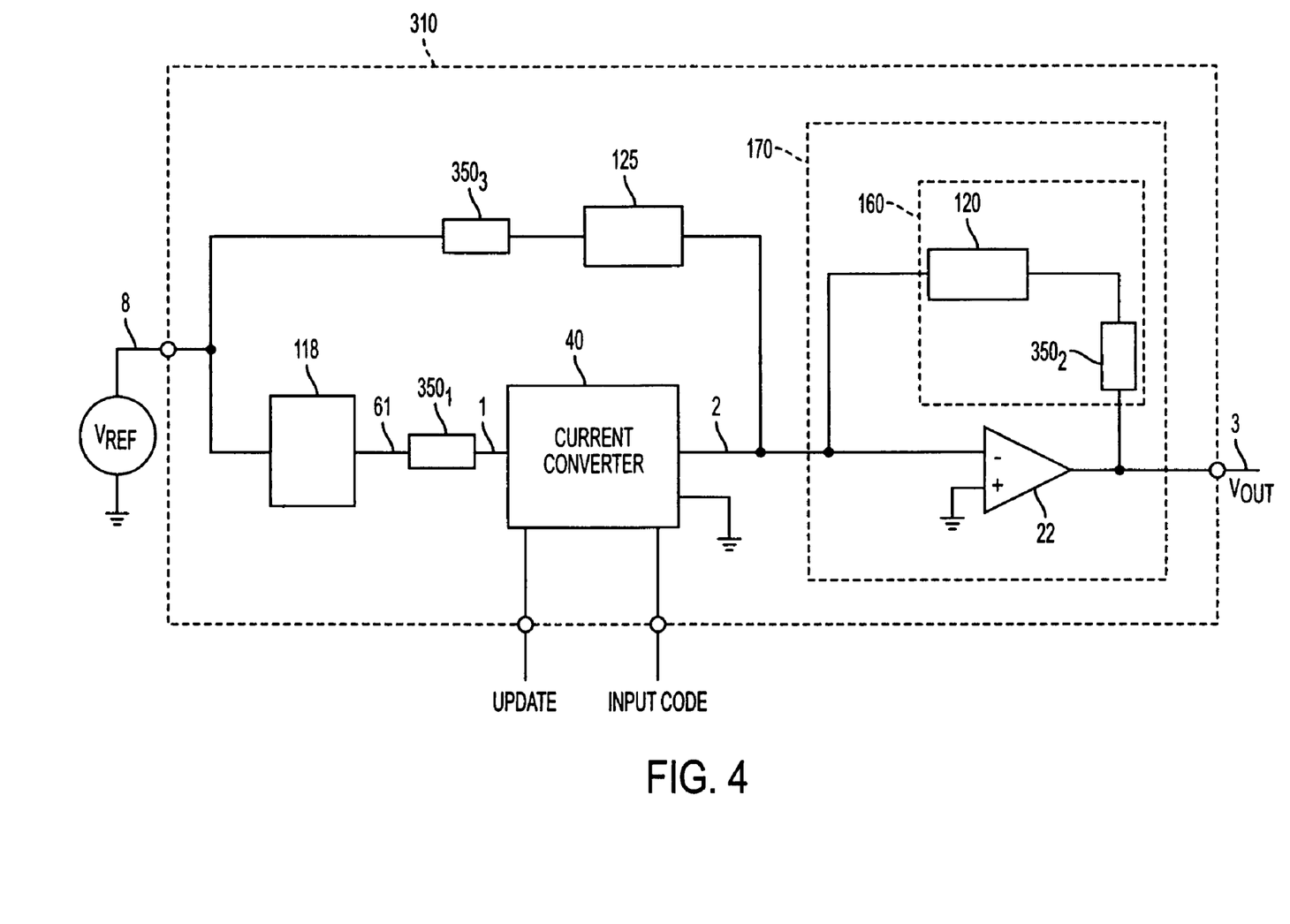
FIG. 4 is a circuit diagram of another improved embodiment corresponding to FIG. 2.

FIG. 4 shows a bipolar DAC 410 similar to DAC 110 improved according to the present invention. DAC 410 comprises current converter 40, output stage 170, reference inverting circuit 114, offset resistive element 125, first trim structure 350$_1$ and third trim structure 350$_3$. The input $V_{REF}$ is applied to input node 8 while the output $V_{OUT}$ is produced at output node 3. An additional DAC node referred henceforth as GROUND is used as a reference potential for both input $V_{REF}$ and output $V_{OUT}$.

Current converter 40, described in FIG. 1 receives control input UPDATE and digital input INPUT CODE and is coupled between nodes 1, 2 and GROUND of DAC 310. The output node 2 of current converter 40 is connected to input terminal of output stage 170. The output terminal of output stage 170 is connected to output node 3 of DAC 310.

The output stage 170 comprises op-amp 22 and resistive element 160. Resistive element 160, comprising series combination of feedback element 120 and second trim structure 350$_2$, is coupled between nodes 2 and 3 implementing a feedback path around op-amp 22. The pre-trim resistance of second trim structure 350$_2$ is referred to as $RT_2$. For illustrative purposes, second trim structure 350$_2$ is shown in FIG. 4 coupled between feedback element 120 and output node 3. However, it will be apparent to those skilled in the art that the relative positions of trim structure 350$_2$ and the series connected components of feedback element 120 (i.e. fixed resistor, trim structure, and switch resistance compensation element) can be changed if desired without affecting circuit behavior.

The reference inverting circuit 114 described in FIG. 2 receives input signal $V_{REF}$ through an input terminal connected to input node 8 and has an output terminal connected at internal node 61 to the first trim structure 350$_1$. First trim structure 350$_1$ is coupled between reference inverting circuit output node 61 and current converter 40 input node 1. Thus first trim structure 350$_1$ is coupled to the most significant bit (MSB) position of the resistance ladder 12 comprised within current converter 40. The pre-trim resistance of first trim structure 350$_1$ is referred to as $RT_1$.

DAC 310 further comprises the series connection of third trim structure 350$_3$ and offset resistive element 125 coupled between input node 8 and output stage 170 input node 2. The pre-trim resistance of third trim structure 350$_3$ is referred to as $RT_3$. For illustrative purposes, trim structure 350$_3$ is shown in FIG. 4 coupled between offset resistive element 125 and input node 8. However, it will be apparent to those skilled in the art that the relative positions of trim structure 350$_3$ and the series connected components of offset resistive element 125 (i.e. fixed resistor, trim structure, and switch resistance compensation element) can be changed if desired without affecting circuit behavior.

DAC 310 ladder pre-trim equivalent input resistance $RT_{DAC}$ is the series combination of current converter 40 equivalent input resistor $R_{DAC}$ and first trim structure 350$_1$ pre-trim resistance $RT_1$ thus:

$$RT_{DAC}=R_{DAC}+RT_1.$$

The output stage resistive element 160 pre-trim equivalent resistance $RT_{FB}$ is the series combination of feedback element 20 equivalent resistance $R_{FB}$ and second trim structure 350$_2$ pre-trim resistance $RT_2$ thus:

$$RT_{FB}=R_{FB}+RT_2.$$

The pre-trim total equivalent offset resistance $RT_{OFFSET}$ of DAC 310 is the series combination of offset resistive element 125 equivalent resistance $R_{OFFSET}$ and third trim structure 350$_3$ pre-trim resistance $RT_3$ thus:

$$RT_{OFFSET}=R_{OFFSET}+RT_3.$$

It is apparent to persons skilled in the art that DAC 310 transfer function is described by the same equation (6) as previously derived DAC 110 transfer function in which $R_{DAC}$ is replaced by $RT_{DAC}$, $R_{FB}$ is replaced by $RT_{FB}$, and $R_{OFFSET}$ is replaced by $RT_{OFFSET}$. Consequently the gain G and coefficient K2 of the bipolar DAC 310 are:

$$G=RT_{FB}/RT_{DAC}=(R_{FB}+RT_2)/(R_{DAC}+RT_1)$$

$$K2=RT_{FB}/RT_{OFFSET}=(R_{FB}+RT_2)/(R_{OFFSET}+RT_3)$$

As aforesaid it is highly desirable for ratio G to be accurate, stable with respect to external factors like temperature, time, etc. and suffer minimal pre-trim errors. It is similarly highly desirable for offset ratio K2 to equal 1 as to minimize DAC offset errors. Toward this goal, first trim structure 350$_1$, second trim structure 350$_2$ and third trim structure 350$_3$ are preferably constructed of mutually identical unit components configured to make pre-trim ratio $RT_2/RT_1$ equal $R_{FB}/R_{DAC}$ ratio and pre-trim ratio $RT_2/RT_3$ equal $R_{FB}/R_{OFFSET}$ ratio. Thus the nominal gain ratio G of DAC 310 is substantially identical with gain ratio G of DAC 110.

$$RT_{FB}/RT_{DAC}=(R_{FB}+RT_2)/(R_{DAC}+RT_1)=R_{FB}/R_{DAC}$$

Similarly the nominal offset ratio K2 of DAC 310 is substantially identical with offset ratio K2 of DAC 110.

$$RT_{FB}/RT_{OFFSET}=(R_{FB}+RT_2)/(R_{OFFSET}+RT_3)=R_{FB}/R_{OFFSET}$$

It should be noted that no restrictions have been introduced with respect to ratios of any one value $RT_1$, $RT_2$, $RT_3$ and any one value $R_{DAC}$, $R_{FB}$, $R_{OFFSET}$. Therefore mutually identical unit components used to construct first trim structure $350_1$; second trim structure $350_2$ and third trim structure $350_3$ may differ from mutually identical unit components used to construct feedback element 20 and resistor ladder 12. Trim structures $350_1$, $350_2$ and $350_3$ may be purposefully sized for trim range and resolution as required by Gain Error adjustment and Bipolar Offset Error adjustment without compromising optimal sizing of feedback element 20 and resistor ladder 12 constituent trim structures.

Persons skilled in the art will recognized from gain ratio G and offset ratio K2 expressions derived above that properly sized trim structures $350_1$, $350_2$ and $350_3$ enable Gain Error and Bipolar Offset Error adjustment for any practical ratio $R_{FB}/R_{DAC}$ that may exist following Linearity Error adjustment and any practical pre-trim error in ratio $R_{FB}/R_{OFFSET}$.

In a preferred method, Gain Error and Bipolar Offset Error adjustment is performed in four steps, following Linearity Error adjustment. Current converter 40 equivalent input resistor changes from pre-trim nominal value $R_{DAC}$ to post-trim value $RPT_{DAC}$ following Linearity Error adjustment. In first step of Gain Error and Bipolar Error adjustment trim structures $350_1$ and $350_2$ are adjusted from nominal pre-trim values $RT_1$ and $RT_2$ to equal or greater post-trim values $RTPT_1$ and $RTPT_2$ respectively. In second step the equivalent value of feedback element 20 is adjusted from pre-trim nominal value $R_{FB}$ to an equal or greater post-trim value $RPT_{FB}$. In third step the trim structure $350_3$ is adjusted from nominal pre-trim value $RT_3$ to an equal or greater post-trim value $RTPT_3$. In the forth step the equivalent value of offset resistive element 125 is adjusted from pre-trim nominal value $R_{OFFSET}$ to an equal or greater post-trim value $RPT_{OFFSET}$.

Gain ratio G and offset ratio K2 following Linearity Error adjustment are:

$$G=(R_{FB}+RT_2)/(RPT_{DAC}+RT_1)$$

$$K2=(R_{FB}+RT_2)/(R_{OFFSET}+RT_3)$$

The Linearity Error adjustment may produce a gain ratio G less or greater than a final gain target value and does not modify offset ratio K2. The first step shall insure that ratio G is less than the gain target value and close enough to said target value for the residual gain error to fall within the trim range of feedback element 20. Furthermore, for a bipolar DAC, the first step must insure that, following second step of this method, offset ratio K2 will be greater than the offset target value (commonly unity) and close enough to said target value for the residual offset error to fall within the trim range of trim structure $350_3$ and offset resistive element 125. A predictive algorithm is still required at the beginning of the first step but the use of purposely sized trim structures $350_1$, $350_2$ and $350_3$ substantially reduces its complexity.

The estimation is performed using commonly known algorithms and is based upon the evaluation of gain ratio G and offset ratio K2 following Linearity Error adjustment. The first step adjusts trim structure $350_1$ and/or trim structure $350_2$ increasing RT1 and/or RT2 accordingly. Trim structures $350_1$ and $350_2$ should be sized recognizing that the trim range available must be large enough to account for worst case changes in $R_{DAC}$ following Linearity Error adjustment and for worst case pre-trim errors in $R_{FB}$ and $R_{OFFSET}$ values. The trim resolution of trim structures $350_1$ and $350_2$ must be fine enough to lower the residual gain error of ratio G with respect to target within the trim range available in feedback element 20.

Gain ratio G and offset ratio K2 following first step of Gain Error and Bipolar Offset Error adjustment are:

$$G=(R_{FB}+RTPT_2)/(RPT_{DAC}+RTPT_1)$$

$$K2=(R_{FB}+RTPT_2)/(R_{OFFSET}+RT_3)$$

The second step should make gain ratio G substantially equal to gain target value using the trim element contained within feedback element 20. Consequently the nominal value $R_{FB}$ is changed into $RPT_{FB}$.

Offset ratio K2 following second step of Gain Error and Bipolar Offset Error adjustment is:

$$K2=(RPT_{FB}+RTPT_2)/(R_{OFFSET}+RT_3)$$

The predictive calculations of the first step insure that the offset ratio K2 is greater than the offset target. The third step should bring offset ratio K2 close enough to said target value for the residual offset error to fall within the trim range of offset resistive element 125. Consequently the nominal value $RT_3$ is changed into $RPT_3$.

Offset ratio K2 following third step of Gain Error and Bipolar Offset Error adjustment is:

$$K2=(RPT_{FB}+RTPT_2)/(R_{OFFSET}+RTPT_3)$$

The fourth and final step should make offset ratio K2 substantially equal to offset target value using the trim element contained within offset resistive element 125. Consequently the nominal value $R_{OFFSET}$ is changed into $RPT_{OFFSET}$.

An additional benefit of the present invention and preferred method is reduced trim resolution for trim structures $350_1$, $350_2$ and $350_3$. As aforementioned, in the desire to reduce pre-trim matching errors, mutually identical unit components are commonly used in implementing constituent trim elements for feedback element 20, resistor ladder 12 and offset resistive element 125. Thus the trim resolution available within feedback element 20 and offset resistive element 125 is very fine as it must match the trim resolution required by Linearity Error adjustment. Using this inherent fine resolution in second and fourth steps of Gain Error adjustment substantially reduces the trim resolution required from trim structures $350_1$, $350_2$ and $350_3$.

Figure 5:
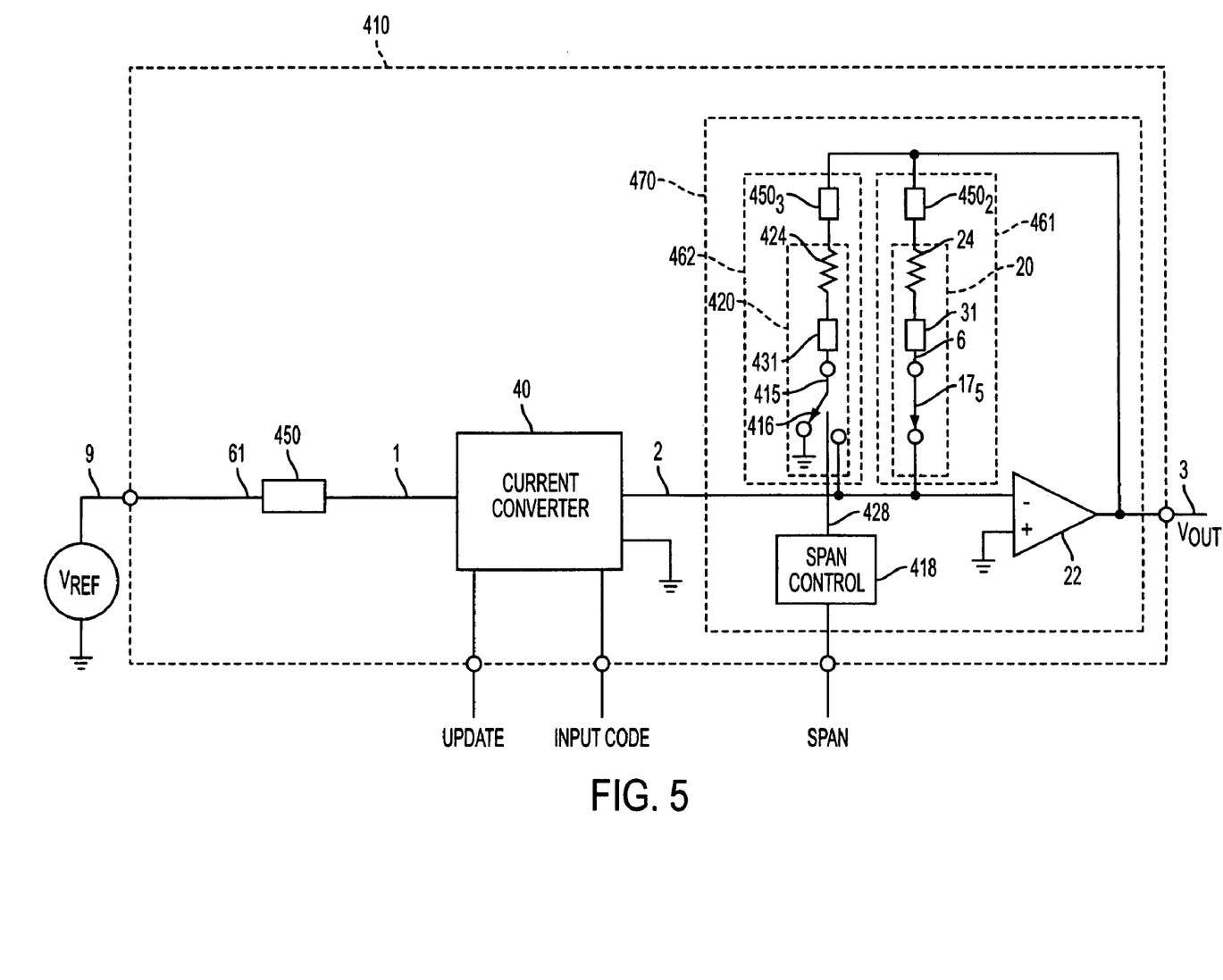
FIG. 5 is a circuit diagram showing a Softspan™ type DAC improved in accord with the principles taught herein.

FIG. 5 shows Softspan™ unipolar DAC 410 of a type described in U.S. Pat. No. 6,310,567, incorporated herein by reference, and improved according to the principles taught by the present invention. DAC 410 comprises current converter 40, output stage 470 and first trim structure $450_1$. The input $V_{REF}$ is applied to input node 9 while the output $V_{OUT}$ is produced at output node 3. An additional DAC node referred henceforth as GROUND is used as a reference potential for both input $V_{REF}$ and output $V_{OUT}$. DAC 410 receives control signal UPDATE and digital input INPUT CODE coupled to current converter 40 and control signal SPAN coupled to output stage 470.

Current converter 40, described in FIG. 1 receives control input UPDATE and digital input INPUT CODE and is coupled between nodes 1, 2 and GROUND of DAC 410. The output node 2 of current converter 40 is connected to input terminal of output stage 470.

The output terminal of output stage 470 is connected to output node 3 of DAC 410. The output stage 470 comprises op-amp 22, resistive elements 461 and 462 and span control block 418. Resistive elements 461 and 462 are coupled in a parallel combination between nodes 2 and 3 implementing a double feedback path around op-amp 22.

Resistive element 461 comprises series combination of feedback element 20 and second trim structure 450$_2$. The pre-trim resistance of second trim structure 450$_2$ is referred to as $RT_2$. The feedback element 20 comprises the series combination of fixed resistor 24, trim structure 31 and switch resistance compensation element 175. The equivalent resistance of feedback element 20 is referred to as $R_{FB}$. The resistive element 461 pre-trim equivalent resistance $RT_{FB}$ is the series equivalent of feedback element 20 equivalent resistance $R_{FB}$ and second trim structure 450$_2$ pre-trim resistance $RT_2$ thus:

$$RT_{FB}=R_{FB}+RT_2.$$

Resistive element 462 comprises series combination of feedback element 420 and third trim structure 450$_3$ and functions as programmable feedback element for op-amp 22. The pre-trim resistance of third trim structure 450$_3$ is referred to as $RT_3$. The feedback element 420 comprises series combination of fixed resistor 424 and trim structure 431 coupled to switch 416 through node 415. Switch 416 couples node 415 to node 2 or GROUND as directed by state of node 428 thus changing the feedback network of op-amp 22. Switch 416 is coupled through node 428 to span control block 418. The equivalent resistance of feedback element 420 is referred to as $RS_{FB}$. The resistive element 462 pre-trim equivalent resistance $RST_{FB}$ is the series equivalent of feedback element 420 equivalent resistance $RS_{FB}$ and third trim structure 450$_3$ pre-trim resistance $RT_3$ thus:

$$RST_{FB}=RS_{FB}+RT_3.$$

Span control block 418 receives control signal SPAN and accordingly sets node 428 directing switch 416 position thus modifying the overall gain of DAC 410. In a first state, when switch 416 couples between node 415 and GROUND, op-amp 22 feedback path includes only resistive element 461 and has equivalent pre-trim resistance value $RT_{FB}$. In a second state, when switch 416 couples between nodes 415 and 2, op-amp 22 feedback path includes the parallel combination of resistive elements 461 and 462 and has equivalent pre-trim resistance value $RT2_{FB}=RT_{FB}\|RST_{FB}$.

DAC 410 further comprises first trim structure 450$_1$ coupled between input node 9 and current converter 40 input node 1. Thus first trim structure 450$_1$ is coupled to the most significant bit (MSB) position of the resistance ladder 12 comprised within current converter 40. The pre-trim resistance of first trim structure 450$_1$ is referred to as $RT_1$. For illustrative purposes, second trim structure 450$_2$ is shown in FIG. 5 coupled between feedback element 20 and output node 3. However, it will be apparent to those skilled in the art that the relative positions of the trim structure 450$_2$ and the series connected components of feedback element 20 (i.e. fixed resistor 24, trim structure 31, and switch resistance compensation element 17$_5$) can be changed if desired without affecting circuit behavior. It should be similarly recognized that the relative positions of trim structure 450$_3$ and the series connected components of feedback element 420 (i.e. fixed resistor 424, trim structure 431, and switch 416) can be changed if desired without affecting circuit behavior.

DAC 410 ladder pre-trim equivalent input resistance $RT_{DAC}$ is the series combination of current converter 40 equivalent input resistor $R_{DAC}$ and first trim structure 450$_1$ pre-trim resistance $RT_1$ thus:

$$RT_{DAC}=R_{DAC}+RT_1.$$

It is apparent to persons skilled in the art that DAC 410 transfer function is described by the same equation (3) as previously derived DAC 10 transfer function in which $R_{DAC}$ is replaced by $RT_{DAC}$ and $R_{FB}$ is replaced by $RT_{FB}$ in first state of control signal SPAN and by $RT2_{FB}$ in second state of control signal SPAN. If DAC 410 overall gain is referred to as G1 in first state of control signal SPAN and as G2 in second state of control signal SPAN than:

$$G1=RT_{FB}/RT_{DAC}=(R_{FB}+RT_2)/(R_{DAC}+RT_1)$$

$$G2=RT2_{FB}/RT_{DAC}=[(R_{FB}+RT_2)\|(RS_{FB}+RT_3)]/(R_{DAC}+RT_1)$$

As aforesaid it is highly desirable for ratios G1 and G2 to be accurate, stable with respect to external factors like temperature, time, etc. and suffer minimal pre-trim errors. Toward this goal, first trim structure 450$_1$, second trim structure 450$_2$ and third trim structure 450$_3$ are preferably constructed of mutually identical unit components configured to make pre-trim ratio $RT_2/RT_1$ equal ratio $R_{FB}/R_{DAC}$ and ratio $RT_3/RT_2$ equal ratio $RS_{FB}/R_{FB}$. Thus the nominal gain ratios G1 and G2 of DAC 410 are substantially independent of pre-trim absolute value of trim structures 450$_1$, 450$_2$ and 450$_3$:

$$G1=RT_{FB}/RT_{DAC}=R_{FB}/R_{DAC}$$

$$G2=RT2_{FB}/RT_{DAC}=(R_{FB}\|RS_{FB})/R_{DAC}$$

It should be noted that no restrictions have been introduced with respect to ratios of any one value $RT_1$, $RT_2$ $RT_3$ and any one value $R_{DAC}$, $R_{FB}$, $RS_{FB}$. Therefore mutually identical unit components used to construct first trim structure 450$_1$, second trim structure 450$_2$ and third trim structure 450$_3$ may differ from mutually identical unit components used to construct feedback element 20, feedback element 420 and resistor ladder 12. Trim structures 450$_1$, 450$_2$ and 450$_3$ may be purposefully sized for trim range and resolution as required by Gain Error adjustment without compromising optimal sizing of feedback element 20, feedback element 420 and resistor ladder 12 constituent trim structures.

Persons skilled in the art will recognized from gain ratios G1 and G2 expression derived above that properly sized trim structures 450$_1$, 450$_2$ and 450$_3$ enable Gain Error adjustment for any practical ratios $R_{FB}/R_{DAC}$ and $RS_{FB}/R_{DAC}$ that may exist following Linearity Error adjustment.

In a preferred method, Gain Error adjustment is performed in four steps, following Linearity Error adjustment. Current converter 40 equivalent input resistor changes from pre-trim nominal value $R_{DAC}$ to post-trim value $RPT_{DAC}$ following Linearity Error adjustment. In first step of Gain Error adjustment trim structures 450$_1$ and 450$_2$ are adjusted from nominal pre-trim values $RT_1$ and $RT_2$ to equal or greater post-trim values $RTPT_1$ and $RTPT_2$ respectively. In second step the equivalent value of feedback element 20 is adjusted from pre-trim nominal value $R_{FB}$ to an equal or greater post-trim value $RPT_{FB}$. In third step the trim structure 350$_3$ is adjusted from nominal pre-trim value $RT_3$ to an equal or greater post-trim value $RTPT_3$. In the forth step the equivalent value of feedback element 420 is adjusted from pre-trim nominal value $RS_{FB}$ to an equal or greater post-trim value $RSPT_{FB}$.

Gain ratios G1 and G2 following Linearity Error adjustment are:

$$G1=(R_{FB}+RT_2)/(RPT_{DAC}+RT_1)$$

$$G2=[(R_{FB}+RT_2)||(RS_{FB}+RT_3)]/(RPT_{DAC}+RT_1)$$

The Linearity Error adjustment may produce gain ratio G1 less or greater than a final first gain target value and gain ratio G2 less or greater than a final second gain target value. The first step shall insure that ratio G1 is less than the first gain target value and close enough to said target value for the residual gain error to fall within the trim range of feedback element 20. Furthermore, the first step must insure that, following second step of this method, gain ratio G2 will be less than the second gain target value and close enough to said target value for the residual gain error to fall within the trim range of trim structure $450_3$ and feedback element 420. A predictive algorithm is still required at the beginning of the first step but the use of purposely sized trim structures $450_1$, $450_2$ and $450_3$ substantially reduces its complexity. The estimation is performed using commonly known algorithms and is based upon the evaluation of gain ratios G1 and G2 following Linearity Error adjustment. The first step adjusts trim structure $450_1$ and/or trim structure $450_2$ increasing RT1 and/or RT2 accordingly. Trim structures $450_1$ and $450_2$ should be sized recognizing that the trim range available must be large enough to account for worst case changes in $R_{DAC}$ following Linearity Error adjustment and for worst case pre-trim errors in $R_{FB}$ and $RS_{FB}$ values. The trim resolution of trim structures $450_1$ and $450_2$ must be fine enough to lower the residual gain error of ratio G1 with respect to first gain target within the trim range available in feedback element 20.

Gain ratios G1 and G2 following first step of Gain Error adjustment are:

$$G1=(R_{FB}+RTPT_2)/(RPT_{DAC}+RTPT_1)$$

$$G2=[(R_{FB}+RTPT_2)||(RS_{FB}+RT_3)]/(RPT_{DAC}+RTPT_1)$$

The second step should make gain ratio G1 substantially equal to first gain target value using the trim element contained within feedback element 20. Consequently the nominal value $R_{FB}$ is changed into $RPT_{FB}$.

Gain ratio G2 following second step of Gain Error adjustment is:

$$G2=[(RPT_{FB}+RTPT_2)||(RS_{FB}+RT_3)]/(RPT_{DAC}+RTPT_1)$$

The predictive calculations of the first step insure that the gain ratio G2 is less than the second gain target. The third step should bring gain ratio G2 close enough to said target value for the residual gain error to fall within the trim range of feedback element 420. Consequently the nominal value $RT_3$ is changed into $RPT_3$.

Gain ratio G2 following third step of Gain Error adjustment is:

$$G2=[(RPT_{FB}+RTPT_2)||(RS_{FB}+RTPT_3)]/(RPT_{DAC}+RTPT_1)$$

The fourth and final step should make gain ratio G2 substantially equal to second gain target value using the trim element contained within feedback element 420. Consequently the nominal value $RS_{FB}$ is changed into $RSPT_{FB}$.

An additional benefit of the present invention and preferred method is reduced trim resolution for trim structures $450_1$, $450_2$ and $450_3$. As aforementioned, in the desire to reduce pre-trim matching errors, mutually identical unit components are commonly used in implementing constituent trim elements for feedback element 20, feedback element 420 and resistor ladder 12. Thus the trim resolution available within feedback element 20 and feedback element 420 is very fine as it must match the trim resolution required by Linearity Error adjustment. Using this inherent fine resolution in second and fourth steps of Gain Error adjustment substantially reduces the trim resolution required from trim structures $450_1$, $450_2$ and $450_3$.

In the example described above, of the principles of the invention are presented within the context of a Softspan™ unipolar DAC. However, persons skilled in this art will readily appreciate that the principles are equally applicable to a Softspan™ bipolar DAC. This can easily be accomplished for example by replacing the feedback resistive element of FIG. 4 with one or more parallel structures that are substantially equal to the switched feedback leg presented in FIG. 5. The bipolar configuration may, for example, comprise four or more trim structures, wherein one or more trim structures is coupled to an offset resistive element and two or more trim structures coupled to respective output stage resistive elements. Further details are not presented, for brevity, as such would be apparent.

For illustrative purposes, this invention has been described for embodiments containing resistor ladder DACs of the R-2R ladder type. A person skilled in the art will see that the invention also applies directly to other known types of DAC resistor networks, including, but not limited to "segmented" and "partially segmented" resistor ladders. For brevity, embodiments of segmented and partially segmented resistor ladders are not described herein, as such are well known to persons skilled in this art. Examples of a segmented resistor ladder architecture may be found in the LTC 1599 DAC and other LTC 159x products. A description of the LTC 1599 DAC, for example, may be found in Linear Technology Databook for LTC 1599, 16-Bit Wide, Low Glitch Muliplying DACs with 4-Quadrant Resistors, incorporated herein by reference.

The problem to be solved and invention are shown herein using examples of trim structures which can be adjusted only by increasing their equivalent value. To a person skilled in the art, it will be obvious that the invention applies equally to alternative embodiments where the trim structure can only be adjusted by decreasing their equivalent value. Furthermore the invention applies equally to alternative embodiments using any trim structures, said embodiments experiencing interaction between successive error adjustments.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

What is claimed is:

1. A digital-to-analog converter, comprising
    at least one input node;
    switches providing an input digital signal;
    an output stage including at least one resistive element;
    a resistance ladder coupled to the switches, the ladder
        including branches corresponding respectively to bit positions, in which selective operation of the switches in response to the input digital signal produces a corresponding analog output signal from the output stage;

a first trim structure coupled to the most significant bit position (MSB) of the resistance ladder; and a second trim structure in the output stage resistive element, and N additional trim structures (N=0, 1, 2, 3, . . . ), wherein the first trim structure is configured to adjust the gain of the digital-to-analog converter without affecting the relative bit weights of the bit positions, and wherein the resistances of the first, second and any additional trim structures, respectively, are substantially of a prescribed ratio prior to any trimming.

2. A digital-to-analog converter as recited in claim 1, in which the output stage comprises an amplifier.

3. A digital-to-analog converter as recited in claim 2, in which the second trim structure resides in a feedback circuit of the amplifier.

4. A digital-to-analog converter as recited in claim 1, in which the output stage comprises a current-to-voltage converter.

5. A digital-to-analog converter as recited in claim 4, in which the second trim structure resides in a feedback resistor of the current-to-voltage converter.

6. The digital-to-analog converter as recited in claim 1, wherein part or all of the digital-to-analog converter is of an R-2R resistance ladder configuration.

7. The digital-to-analog converter as recited in claim 1, wherein part or all of the digital-to-analog converter is of segmented resistance ladder configuration.

8. The digital-to-analog converter as recited in claim 1, in which the trim structures are laser-trimmable.

9. The digital-to-analog converter as recited in claim 1, wherein the trim structures are fuse trimmable.

10. The digital-to-analog converter as recited in claim 1, wherein the value of some or all of the trim structures are under the control of a digital signal.

11. The digital-to-analog converter as recited in claim 1, in which the converter is unipolar.

12. The digital-to-analog converter as recited in claim 1, in which the converter is bipolar and comprises 3 or more trim structures wherein at least one trim structure is coupled to an offset resistive element.

13. The digital-to-analog converter as recited in claim 1, in which the digital-to-analog converter is of a Softspan™ unipolar configuration comprising 3 or more trim structures, wherein one or more trim structures are coupled to respective output stage resistive elements.

14. The digital-to-analog converter as recited in claim 1, in which the digital-to-analog converter is of a Softspan™ bipolar configuration comprising 4 or more trim structures, wherein one or more trim structures is coupled to an offset resistive element and 2 or more trim structures are coupled to respective output stage resistive elements.

15. In a digital-to-analog converter of a type comprising at least one input node; switches providing an input digital signal; an output stage including at least one resistive element; a resistance ladder coupled to the switches, the ladder including branches corresponding respectively to bit positions, in which selective operation of the switches in response to the input digital signal produces a corresponding analog output signal from the output stage, a method of trimming the converter implements a first trim structure coupled to the most significant bit position (MSB) of the resistance ladder, and a second trim structure in the output stage resistive element, in which there may be included N additional trim structures (N=0, 1, 2, 3, . . . ), wherein the method comprises:

trimming the first trim structure to adjust the gain of the digital-to-analog converter by which the relative bit weights of the bit positions are not affected, and wherein the resistances of the first, second and any additional trim structures, respectively, are substantially of a prescribed ratio prior to any trimming.

* * * * *

UNITED STATES PATENT AND TRADEMARK OFFICE
CERTIFICATE OF CORRECTION

| | | |
|---|---|---|
| PATENT NO. | : 7,034,735 B1 | Page 1 of 1 |
| APPLICATION NO. | : 11/108895 | |
| DATED | : April 25, 2006 | |
| INVENTOR(S) | : Pat Copley | |

It is certified that error appears in the above-identified patent and that said Letters Patent is hereby corrected as shown below:

In Column 1, Line 61, change "The first switched connected" to --The first switched branch comprises two fixed resistors, $23_{11}$ and $23_{12}$, and two trim structures $30_{11}$ and $31_{12}$, all connected--;

Line 66, change "input node 1 and network and two trim structures $30_{21}$ and" to --input node 1 and network internal node 4. The second switched branch comprises two fixed resistors, $23_{21}$ and $23_{22}$, and two trim structures $30_{21}$ and--;

In Column 2, after "...(LSB) on Line 8" and before "structures $30_{41}$...", add --of the ladder. The forth branch comprises two fixed resistors, $23_{41}$ and $23_{42}$, and two trim--;

In Column 3, Line 9, change "MAX INPUT CODE=$2^3$-=7" to --MAX INPUT CODE=$2^3$-1=7--;

In Column 7, Line 63, change "2502" to --$250_2$--;

In Column 8, Line 11, change "175" to --$17_5$--;

In Column 9, Line 45, change "2502" to --$250_2$--;

In Column 10, Line 41, change "3502" to --$350_2$--; and

In Column 16, Line 43, add --1999-- after the word "Resistors," and before "incor-".

Signed and Sealed this

Seventh Day of October, 2008

JON W. DUDAS
*Director of the United States Patent and Trademark Office*